(12) United States Patent
Wang et al.

(10) Patent No.: US 10,453,938 B2
(45) Date of Patent: Oct. 22, 2019

(54) TRANSISTOR WITH DUAL SPACER AND FORMING METHOD THEREOF

(71) Applicant: UNITED MICROELECTRONICS CORP., Hsin-Chu (TW)

(72) Inventors: Chia-Ling Wang, Yunlin County (TW); Ping-Hung Chiang, Hsinchu (TW); Chang-Po Hsiung, Hsinchu (TW); Chia-Wen Lu, Chiayi County (TW); Nien-Chung Li, Hsinchu (TW); Wen-Fang Lee, Hsinchu (TW); Chih-Chung Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/846,150

(22) Filed: Dec. 18, 2017

(65) Prior Publication Data

US 2019/0157418 A1 May 23, 2019

(30) Foreign Application Priority Data

Nov. 17, 2017 (CN) .......................... 2017 1 1146633

(51) Int. Cl.
*H01L 29/66* (2006.01)
*H01L 27/088* (2006.01)
(Continued)

(52) U.S. Cl.
CPC .... *H01L 29/6656* (2013.01); *H01L 21/31111* (2013.01); *H01L 21/823418* (2013.01); *H01L 21/823437* (2013.01); *H01L 21/823456* (2013.01); *H01L 21/823462* (2013.01); *H01L 21/823468* (2013.01); *H01L 27/088* (2013.01); *H01L 29/0847* (2013.01); *H01L 29/42364* (2013.01); *H01L 29/665* (2013.01); *H01L 29/6653* (2013.01); *H01L 29/66553* (2013.01);
(Continued)

(58) Field of Classification Search
CPC ....... H01L 21/31111; H01L 21/823437; H01L 21/823462; H01L 21/82346; H01L 27/088; H01L 29/6656; H01L 29/665; H01L 29/6653; H01L 29/66553; H01L 29/66575; H01L 29/7833; H01L 29/7847; H01L 29/0649
See application file for complete search history.

(56) References Cited

U.S. PATENT DOCUMENTS 5,716,875 A * 2/1998 Jones, Jr. ............. H01L 21/8221
257/E21.009
7,192,881 B2 * 3/2007 Kammler .......... H01L 21/02164
257/E21.252
(Continued)

*Primary Examiner* — Joseph M Galvin, III
(74) *Attorney, Agent, or Firm* — Winston Hsu

(57) ABSTRACT

A transistor with dual spacers includes a gate, a first dual spacer and a second inner spacer. The gate is disposed on a substrate, wherein the gate includes a gate dielectric layer and a gate electrode, and the gate dielectric layer protrudes from the gate electrode and covers the substrate. The first dual spacer is disposed on the gate dielectric layer beside the gate, wherein the first dual spacer includes a first inner spacer and a first outer spacer. The second inner spacer having an L-shaped profile is disposed on the gate dielectric layer beside the first dual spacer. The present invention also provides a method of forming said transistor with dual spacers.

7 Claims, 5 Drawing Sheets

(51) Int. Cl.
    *H01L 29/08* (2006.01)
    *H01L 29/78* (2006.01)
    *H01L 21/311* (2006.01)
    *H01L 21/8234* (2006.01)
    *H01L 29/423* (2006.01)
    *H01L 29/06* (2006.01)

(52) U.S. Cl.
    CPC .... *H01L 29/66575* (2013.01); *H01L 29/7833* (2013.01); *H01L 29/7847* (2013.01); *H01L 29/0649* (2013.01)

(56) References Cited

U.S. PATENT DOCUMENTS

| | | | |
|---|---|---|---|
| 7,217,626 | B2 | 5/2007 | Bu |
| 8,916,432 | B1* | 12/2014 | Ramkumar ....... H01L 21/28282 |
| | | | 438/216 |
| 2006/0019456 | A1 | 1/2006 | Bu |
| 2011/0124173 | A1* | 5/2011 | Kim et al. ........ H01L 27/10873 |
| | | | 438/305 |
| 2012/0248511 | A1 | 10/2012 | Guo |
| 2014/0248749 | A1 | 9/2014 | Hoentschel |
| 2015/0069524 | A1* | 3/2015 | Hong ................. H01L 27/1203 |
| | | | 257/392 |

\* cited by examiner

TRANSISTOR WITH DUAL SPACER AND FORMING METHOD THEREOF

BACKGROUND OF THE INVENTION

1. Field of the Invention

The present invention relates generally to a transistor with spacers and forming method thereof, and more specifically to a transistor with dual spacers and forming method thereof.

2. Description of the Prior Art

Field effect transistors are important electronic devices in the fabrication of integrated circuits. In the conventional method of fabricating transistors, a gate structure is first formed on a substrate, and a lightly doped drain (LDD) is formed on the two corresponding sides of the gate structure. Next, a spacer is formed on the sidewall of the gate structure and an ion implantation process is performed to form a source/drain region within the substrate by utilizing the gate structure and spacer as a mask. In order to incorporating the gate, the source, and the drain into the circuit, contact plugs are often utilized for interconnection purposes. Each of the contact plugs include a barrier layer surrounding a low resistivity material to prevent the low resistivity material from diffusing outward to other areas.

As the size of the semiconductor device becomes smaller and smaller, the fabrication of the transistors also improves and is constantly enhanced for fabricating transistors with smaller sizes and higher quality. For example, the semiconductor device is enhanced through improving the shapes and the sizes of spacers, or relative positions of spacers to other elements.

SUMMARY OF THE INVENTION

The present invention provides a transistor with dual spacers and forming method thereof, which forms dual spacers, and the inner spacers of the dual spacers have L-shaped profiles, thereby the distance between the source/drain and the gate can being adjusted.

The present invention provides a transistor with dual spacers including a gate, a first dual spacer and a second inner spacer. The gate is disposed on a substrate, wherein the gate includes a gate dielectric layer and a gate electrode, and the gate dielectric layer protrudes from the gate electrode and covers the substrate. The first dual spacer is disposed on the gate dielectric layer beside the gate, wherein the first dual spacer includes a first inner spacer and a first outer spacer. The second inner spacer having an L-shaped profile is disposed on the gate dielectric layer beside the first dual spacer.

The present invention provides a transistor with dual spacers including a gate dielectric layer, a gate electrode, a spacer and a first dual spacer. The gate dielectric layer is disposed on a substrate. The gate electrode is disposed on the gate dielectric layer. The spacer is disposed on the gate dielectric layer beside the gate electrode. The first dual spacer including a first inner spacer is disposed on the gate dielectric layer beside the spacer, wherein the first inner spacer has an L-shaped profile.

The present invention provides a method of forming a transistor with dual spacers including the following steps. A gate dielectric layer and a gate electrode are formed on a substrate. A first dual spacer including a first inner spacer and a first outer spacer is formed on the gate dielectric layer beside the gate electrode. A second dual spacer including a second inner spacer having an L-shaped profile and a second outer spacer is formed on the gate dielectric layer beside the first dual spacer. The second outer spacer is removed.

According to the above, the present invention provides a transistor with dual spacers and forming method thereof, which forms dual spacers to adjust the distance between the source/drain and the gate, thus avoiding high electric field occurring between the source/drain and the gate. This improves the electrical performance. Besides, the location of a source/drain or a metal silicide can be prevented from being too close to the gate, by disposing the inner spacers of the dual spacers having L-shaped profiles.

These and other objectives of the present invention will no doubt become obvious to those of ordinary skill in the art after reading the following detailed description of the preferred embodiment that is illustrated in the various figures and drawings.

DETAILED DESCRIPTION

A gate-last for high-K first, buffer layer first process is applied in the following embodiment, but the present invention is not restricted thereto. For simplifying the present invention, there are two transistors presented, but the number of the transistors is not limited thereto.

Figure 1:
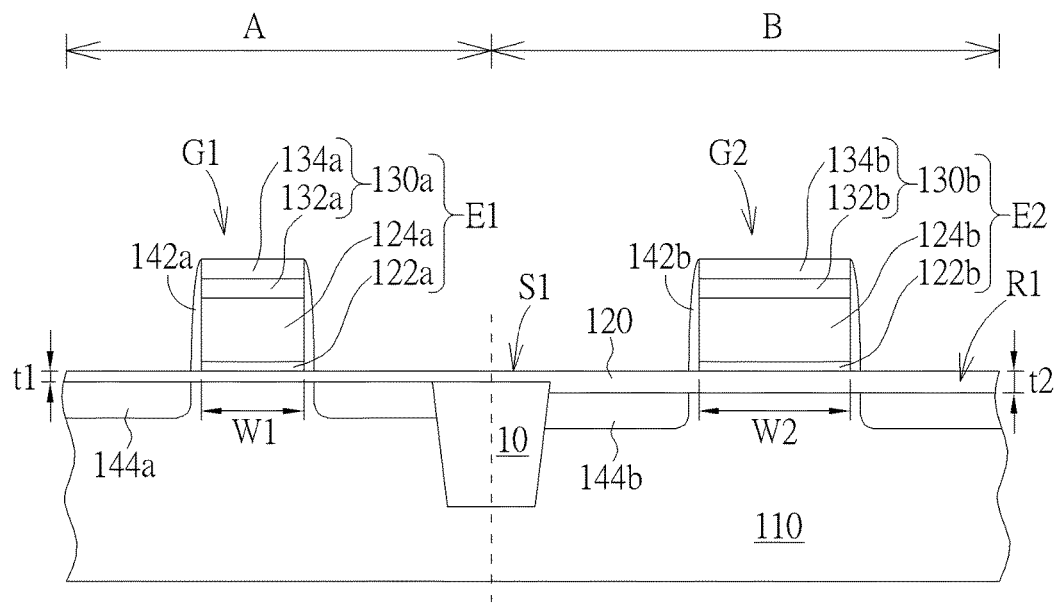
FIGS. 1-10 schematically depict cross-sectional views of a method of forming a transistor with dual spacers according to an embodiment of the present invention.

FIGS. 1-10 schematically depict cross-sectional views of a method of forming a transistor with dual spacers according to an embodiment of the present invention. As shown in FIG. 1, a first gate G1 and a second gate G2 are formed on a substrate 110. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The substrate 110 may include a first area A and a second area B. In this embodiment, a first gate G1 is located in the first area A while a second gate G2 is located in the second area B, and the first area A is an active area of a low voltage transistor such as a logic circuit active area while the second area B is an active area of a high voltage transistor, thereby the first gate G1 being a gate of a low voltage transistor while the second area B being a gate of a medium voltage transistor, but it is not limited thereto. Thus, the size of the first gate G1 is less than the size of the second gate G2, and a width W1 of the gate channel of the first gate G1 is less than a width W2 of the gate channel of the second gate G2, but it is not limited thereto.

More precisely, the steps of forming the first gate G1 and the second gate G2 having different sizes may include the following. An isolation structure 10 may be formed in the substrate 110 by etching and lithography processes. In this embodiment, the isolation structure 10 may be a shallow trench isolation (STI) structure, which may be formed through a shallow trench isolation process, and the forming method is known in the art, and will not be described herein, but it is not limited thereto. In another embodiment, the isolation structure 10 may be a field oxide (FOX) structure, but it is not limited thereto.

A recess R1 may be optionally formed in the substrate 110 of the second area B, and then a gate dielectric layer 120 blanketly covers the substrate 110 of the first area A and the second area B, thereby a thickness t1 of the gate dielectric layer 120 in the first area A is less than a thickness t2 of the gate dielectric layer 120 in the second area B. By doing this, the gate dielectric layer 120 has a flat top surface S1. The gate dielectric layer 120 may be formed by an in-situ steam generation (ISSG) process or a thermal oxide process, but it is not limited thereto. In another embodiment, a dielectric layer having common thicknesses in the first area A and the second area B is formed blanketly, and then the dielectric layer in the first area A is partially removed or thinned down, therefore a dielectric layer (not shown) having a thickness in the first area A thinner than a thickness in the second area B being formed. Thereby, a dielectric layer having different thicknesses in the first area A and the second area B can be formed.

As shown in FIG. 1, a first gate electrode E1 and a second gate electrode E2 are respectively formed on the gate dielectric layer 120 of the first area A and on the gate dielectric layer 120 of the second area B. Thus, the gate dielectric layer 120 protrudes from the first gate electrode E1 and the second gate electrode E2 and covers the substrate 110. More precisely, the first gate electrode E1 may include a dielectric layer having a high dielectric constant 122a, a sacrificial electrode layer 124a and a cap layer 130a stacked from bottom to top, and the cap layer 130a may include a nitride layer 132a and an oxide layer 134a stacked from bottom to top; the second gate electrode E2 may include a dielectric layer having a high dielectric constant 122b, a sacrificial electrode layer 124b and a cap layer 130b stacked from bottom to top, and the cap layer 130b may include a nitride layer 132b and an oxide layer 134b stacked from bottom to top, but it is not limited thereto. Methods of forming the dielectric layer having a high dielectric constant 122a/122b, the sacrificial electrode layer 124a/124b and the cap layer 130a/130b may include the following. A dielectric layer having a high dielectric constant (not shown), a sacrificial electrode layer (not shown) and a cap layer (not shown) are sequentially stacked on the gate dielectric layer 120 of the first area A and the second area B, and then the cap layer (not shown), the sacrificial electrode layer (not shown) and the dielectric layer having a high dielectric constant (not shown) are patterned to form the first gate electrode E1 and the second gate electrode E2.

A spacer 142a/142b is formed on the substrate 110 (the gate dielectric layer 120) beside the first gate G1 and the second gate G2 respectively. The spacer 142a/142b may be a single layer or a multilayer constituted by materials such as silicon nitride or silicon oxide etc. In this embodiment, the spacer 142a/142b is a single nitride spacer. A lightly doped ion implantation process may be performed to form a lightly doped source/drain 144a/144b in the substrate 110 beside the spacer 142a/142b respectively. The lightly doped source/drain 144a and the lightly doped source/drain 144b may be doped respectively depending upon required concentrations, and the locations of the lightly doped source/drain 144a and the lightly doped source/drain 144b depend upon the spacer 142a and the spacer 142b. Dopants of the lightly doped ion implantation process may be trivalent ions such as boron or pentavalent ions such as phosphorum, depending upon the electrically types of the first gate G1 and the second gate G2. In this case, the first gate G1 and the second gate G2 have common conductive types, but different sizes, thus the lightly doped source/drain 144a and the lightly doped source/drain 144b having common conductive types, but may having different kinds of ions or different concentrations of ions. In another case, the first gate G1 and the second gate G2 have different conductive types.

Figure 2:
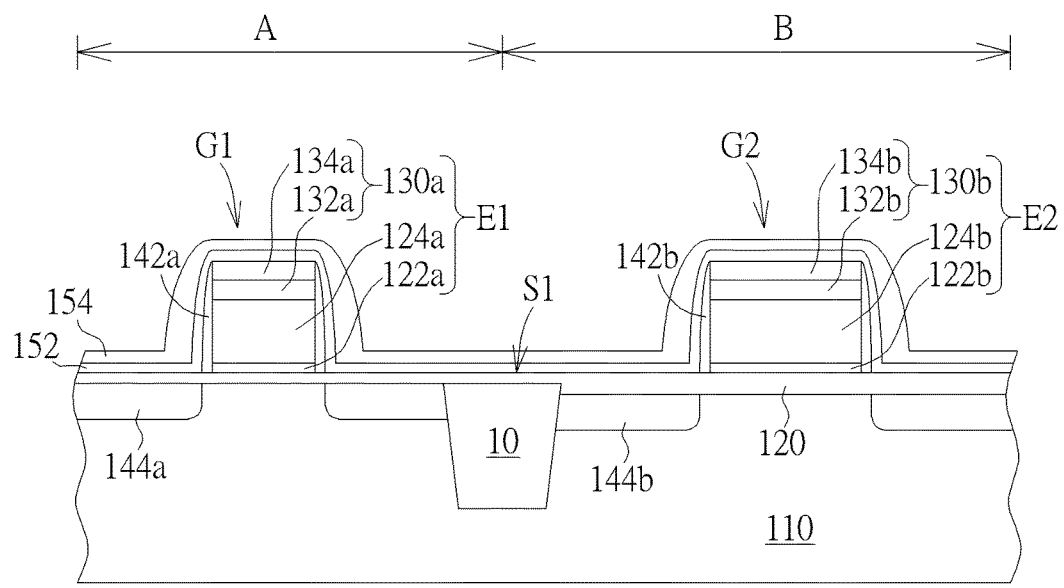
Figure 3:
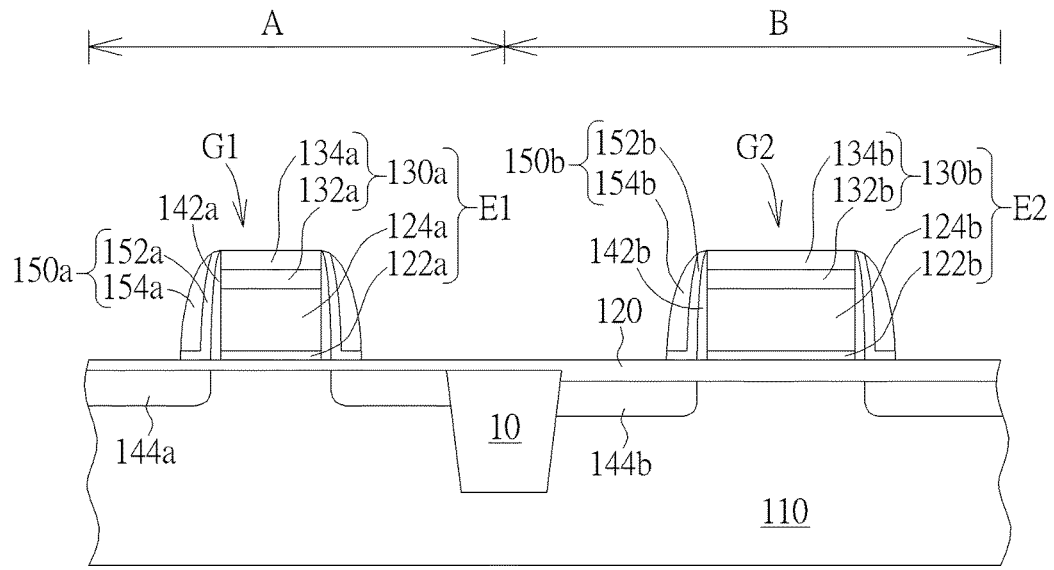

Please refer to FIGS. 2-3, a first dual spacer 150a/150b is formed on the gate dielectric layer 120 beside the gate electrode E1/E2 respectively. In this embodiment, the first dual spacer 150a and the first dual spacer 150b may have common spacers having common sizes and thicknesses, and may be formed at the same time. In another embodiment, the first dual spacer 150a and the first dual spacer 150b may be different spacers and may be formed respectively. The first dual spacer 150a or the first dual spacer 150b may be a single layer or a multilayer constituted by materials such as silicon nitride or silicon oxide etc. In this case, the first dual spacer 150a includes a first inner spacer 152a and a first outer spacer 154a while the first dual spacer 150b includes a first inner spacer 152b and a first outer spacer 154b, and the first inner spacer 152a and the first inner spacer 152b have L-shaped profiles, but it is not limited thereto. Preferably, the first inner spacer 152a/152b is an oxide spacer, and the first inner spacer 152a/152b therefore has different material from the spacer 142a/142b, which is a single nitride spacer, thereby the first inner spacer 152a/152b and the spacer 142a/142b have etching selectivity. Similarly, the first outer spacer 154a/154b is preferably a nitride spacer, for the first outer spacer 154a/154b having different material from the first inner spacer 152a/152b, thereby the first inner spacer 152a/152b and the first outer spacer 154a/154b have etching selectivity, but it is not limited thereto.

More precisely, a first inner spacer material 152 and a first outer spacer material 154 are formed to blanketly cover the gate dielectric layer 120, the gate electrode E1 and the gate electrode E2, and then the first inner spacer material 152 and the first outer spacer material 154 are etched to form the first dual spacer 150a and the first dual spacer 150b at the same time, wherein the first dual spacer 150a and the first dual spacer 150b both have L-shaped profiles.

Figure 4:
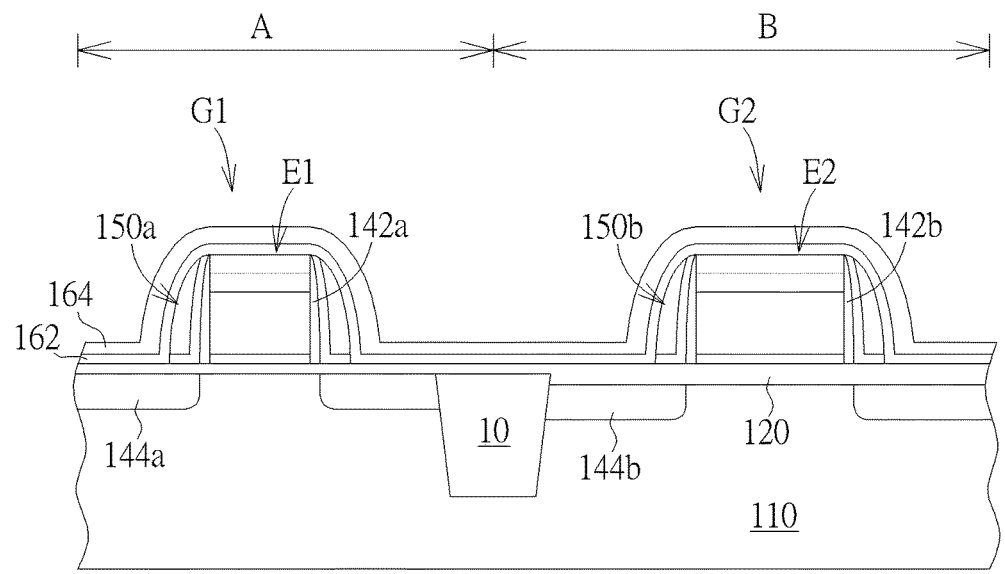

As shown in FIG. 4, a second inner spacer material 162 and a second outer spacer material 164 are formed to blanketly cover the gate dielectric layer 120, the gate electrode E1 and the gate electrode E2. In this embodiment, the second inner spacer material 162 is an oxide layer while the second outer spacer material 164 is a nitride layer, but it is not limited thereto. Methods of forming the second inner spacer material 162 and the second outer spacer material 164 may be using stress memorization technique (SMT), therefore the second outer spacer material 164 is a stress material layer.

Figure 5:
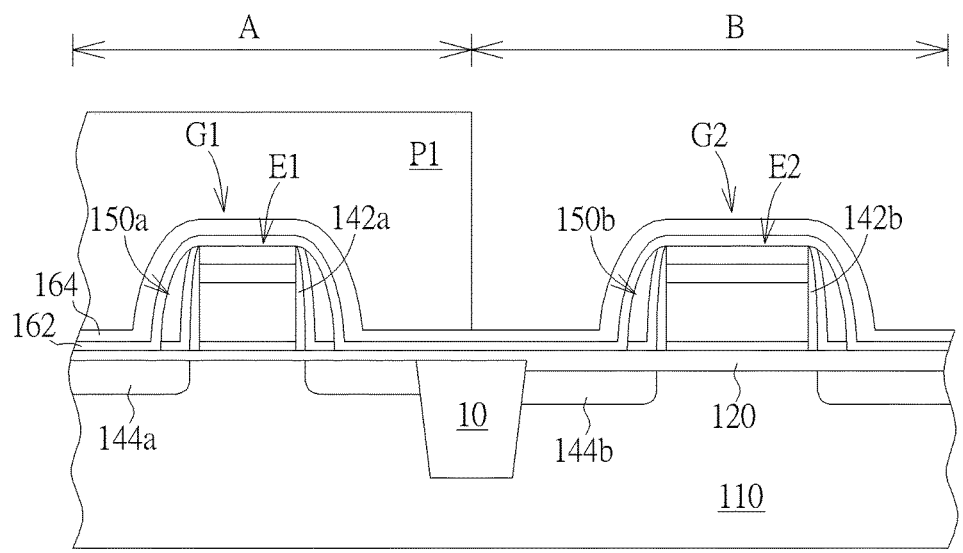
Figure 6:
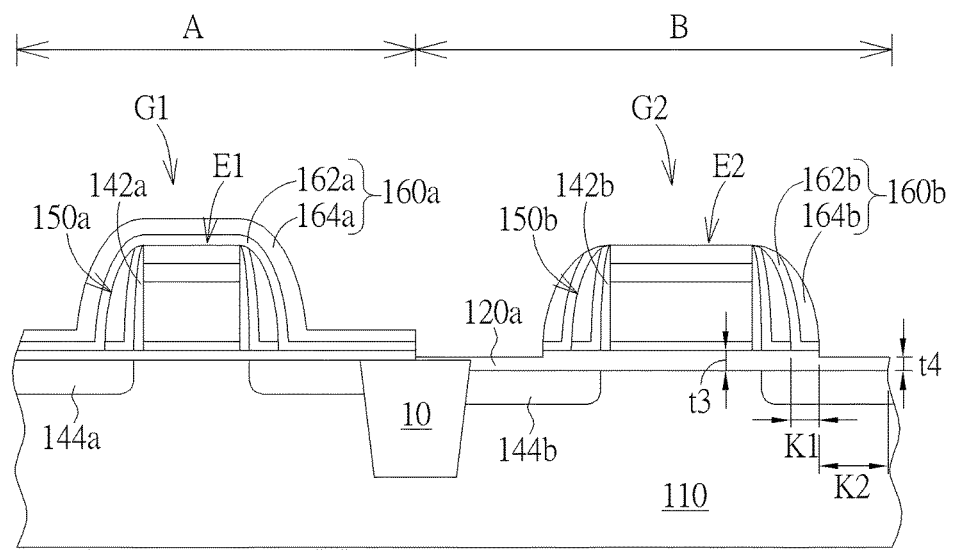

As shown in FIGS. 5-6, only the second outer spacer material 164 and the second inner spacer material 162 in the second area B is etched, thereby a second dual spacer 160b being formed in the second area B. As shown in FIG. 5, a photoresist P1 covers the first area A and exposes the second area B. As shown in FIG. 6, the second outer spacer material 164 and the second inner spacer material 162 in the second area B are etched to only form the second dual spacer 160b in the second area B, and to preserve a second inner spacer material 162a and a second outer spacer material 164a in the first area A. Thereafter, the photoresist P1 is removed. The second dual spacer 160b may include a second inner spacer 162b and a second outer spacer 164b, and the second inner spacer 162b has a L-shaped profile.

The gate dielectric layer 120 of the second area B is also etched and thus is thinned to become a gate dielectric layer 120a while the second outer spacer material 164 and the second inner spacer material 162 of the second area B are etched. Thus, the gate dielectric layer 120a protruding from the second gate electrode E2 may at least include a first part K1 and a second part K2, wherein the first part K1 is located right below the second inner spacer 162b and the second part K2 (meaning the exposed part of the gate dielectric layer 120a) is uncovered by the second inner spacer 162b. Since the second part K2 is thinned down while the second outer spacer material 164 and the second inner spacer material 162 in the second area B are etched. Therefore, a thickness t3 of the first part K1 is larger than a thickness t4 of the second part K2.

Figure 7:
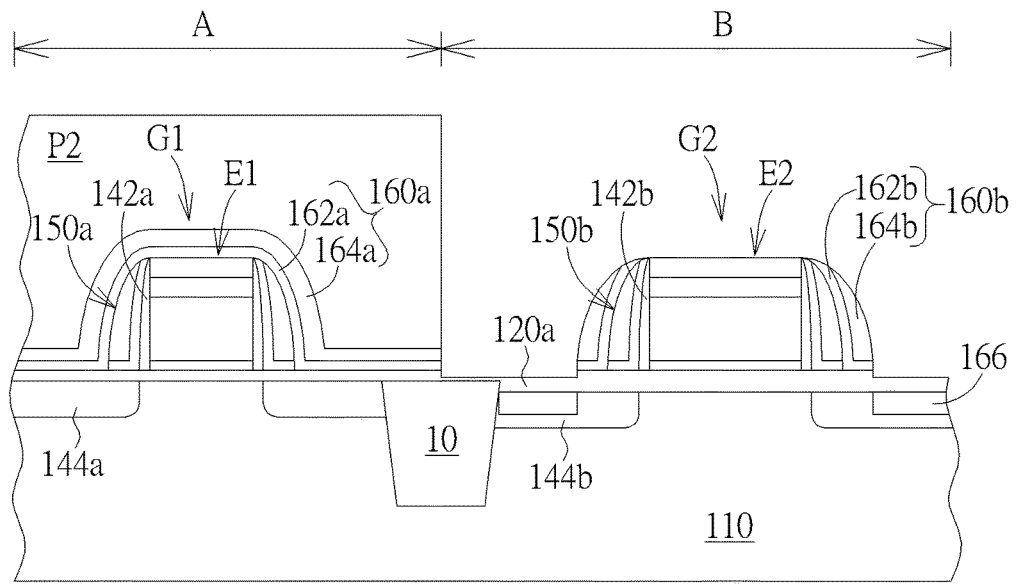

As shown in FIG. 7, a photoresist P2 covers the first area A and exposes the second area B, and then an ion implantation process is performed to form a source/drain 166 in the substrate 110 beside the second dual spacer 160b in the second area B. Dopants of the ion implantation process may be trivalent ions such as boron or pentavalent ions such as phosphorum, depending upon the electrically type of the second gate G2. Thereafter, the photoresist P2 is removed.

Figure 8:
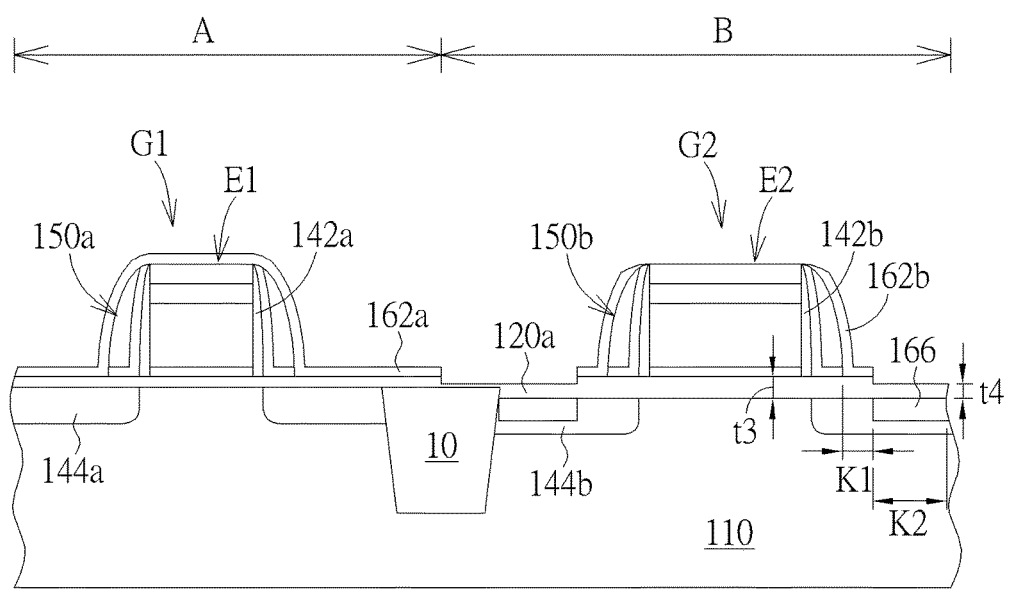

Then, the second outer spacer 164b is removed and the second inner spacer 162b is preserved, as shown in FIG. 8. In this embodiment, the second outer spacer material 164a of the first area A is removed while the second outer spacer 164b of the second area B is removed, but the second inner spacer material 162a is still preserved.

Figure 9:
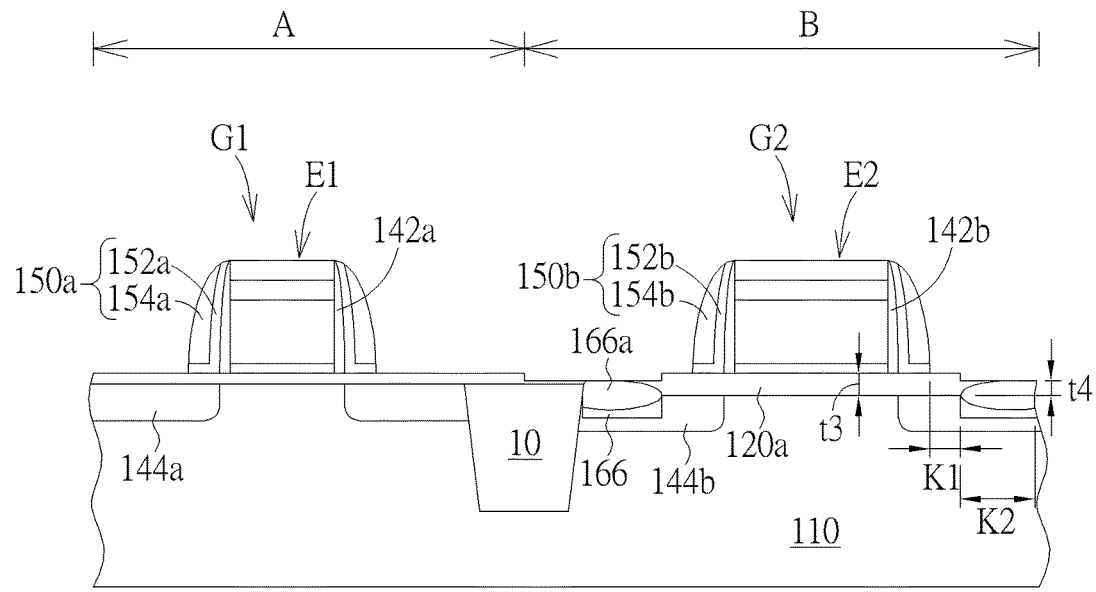

As shown in FIG. 9, a salicide process may be performed to form a metal silicide 166a on the source/drain 166 after the second outer spacer 164b of the second area B is removed. Since the first part K1 of the gate dielectric layer 120a of FIG. 8 is preserved, the metal silicide 166a can be restrained and only be formed beside the first part K1 without extending to the substrate 110 right below the first part K1 because of the thickness t3 of the first part K1 being thick enough. Meanwhile, the thickness t4 of the second part K2 is also thin enough for the metal silicide 166a being formed in the second part K2.

Figure 10:
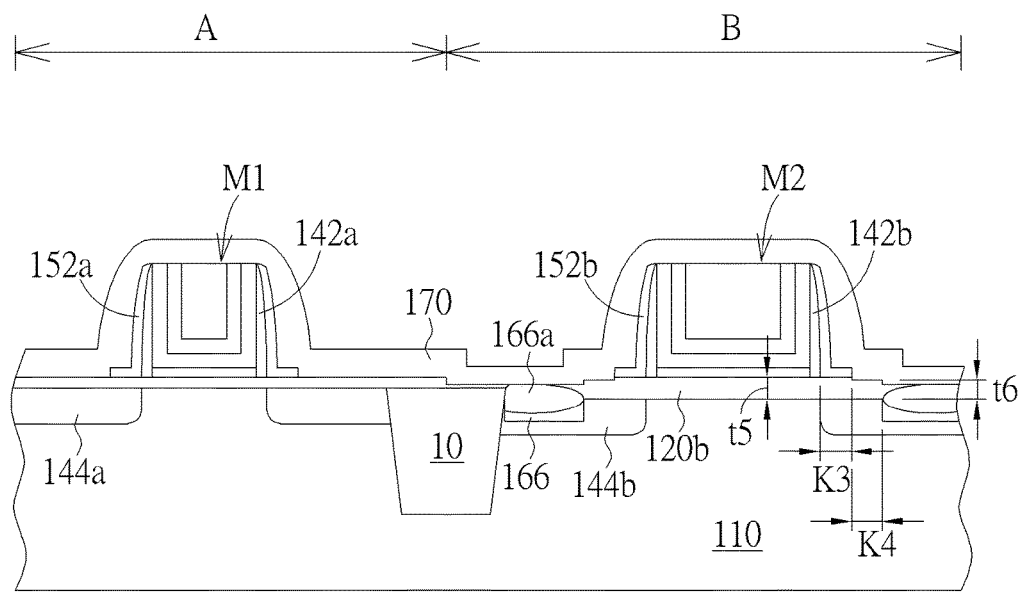

After the metal silicide 166a is formed on the source/drain 166, the first outer spacer 154b is removed but the first inner spacer 152b is preserved, as shown in FIG. 10. In this embodiment, the first outer spacer 154a in the first area A is removed while the first outer spacer 154b in the second area B is removed, the first inner spacer 152a in the first area A is reserved, and a gate dielectric layer 120b is formed.

The sacrificial electrode layer 124a and the cap layer 130a of the first gate electrode E1, and the sacrificial electrode layer 124b and the cap layer 130b of the second gate electrode E2 may be removed while the first outer spacer 154a of the first area A and the first outer spacer 154b of the second area B are removed. Then, a first metal gate M1 and a second metal gate M2 fill respectively to replace the first gate electrode E1 with the first metal gate M1 and to replace the second gate electrode E2 with the second metal gate M2, wherein a metal gate replacement process is well known in the art and is not described herein. Thereafter, a contact etch stop layer 170 may entirely cover and directly contact the first inner spacer 152a and the first inner spacer 152b.

As shown in FIG. 10, the gate dielectric layer 120b protruding from the second metal gate M2 at least includes a third part K3 and a fourth part K4, wherein the third part K3 is located right below the first inner spacer 152b, but the fourth part K4 is uncovered by the first inner spacer 152b. Since the fourth part K4 in thinned down while the second outer spacer 164b of the second area B is removed, a thickness t5 of the third part K3 is larger than a thickness t6 of the fourth part K4. By doing this, the fourth part K4 is located between the source/drain 166 and the first inner spacer 152b. In other words, the distance between the source/drain 166 and the second metal gate M2 can be adjusted by forming the spacer 142b, the first dual spacer 150b and the second dual spacer 160b.

To summarize, the present invention provides a transistor with dual spacers and forming method thereof, which forms a second dual spacer beside a second gate to adjust the distance between the source/drain and the gate, thus avoiding high electric field occurring between the source/drain and the gate. This improves the electrical performance. Besides, the location of a source/drain or a metal silicide can be prevented from being too close to the gate, by disposing the inner spacer of the second dual spacer having a L-shaped profile. Moreover, the gate dielectric layer of the present invention entirely covers the substrate, so that the gate dielectric layer can have multi partial thicknesses through the etchings of spacers. Hence, the metal silicide can be formed and the forming regions of the source/drain and the metal silicide can be restrained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transistor with dual spacers, comprising:
   a gate disposed on a substrate, wherein the gate comprises a gate dielectric layer and a gate electrode, and the gate dielectric layer protrudes from the gate electrode and covers the substrate;
   a first dual spacer disposed on the gate dielectric layer beside the gate, wherein the first dual spacer comprises a first inner spacer and a first outer spacer;
   a second inner spacer having an L-shaped profile disposed on the gate dielectric layer beside the first dual spacer, wherein the gate dielectric layer protruding from the gate electrode comprises a first part and a second part, wherein the first part is right below the second inner spacer, and the second part is uncovered by the second inner spacer, wherein a thickness of the first part is larger than a thickness of the second part; and
   a source/drain disposed in the substrate beside the second inner spacer, wherein the second part vertically overlaps the source/drain completely.

2. The transistor with dual spacers according to claim 1, wherein the substrate has a recess, and the gate dielectric layer is disposed in the recess.

3. The transistor with dual spacers according to claim 1, further comprising:
   a spacer disposed on the substrate between the gate and the first dual spacer; and
   a lightly doped source/drain disposed in the substrate beside the spacer.

4. The transistor with dual spacers according to claim 1, further comprising:
   a first gate disposed on the substrate, wherein the gate is a gate of a medium voltage transistor while the first gate is a gate of a low voltage transistor, and the second inner spacer having the L-shaped profile is only disposed on the substrate beside the gate.

5. A transistor with dual spacers, comprising:
   a gate dielectric layer disposed on a substrate;
   a gate electrode disposed on the gate dielectric layer;
   a spacer disposed on the gate dielectric layer beside the gate electrode;
   a first dual spacer comprising a first inner spacer disposed on the gate dielectric layer beside the spacer, wherein the first inner spacer has an L-shaped profile, the gate dielectric layer protrudes from the gate electrode, and the gate dielectric layer comprises a third part and a fourth part, wherein the third part is right below the first inner spacer, and the fourth part is uncovered by the first inner spacer, wherein a thickness of the third part is larger than a thickness of the fourth part; and a source/drain disposed in the substrate beside the first inner spacer, wherein the fourth part is between the source/drain and the first inner spacer.

6. The transistor with dual spacers according to claim 5, wherein the substrate has a recess, and the gate dielectric layer is disposed in the recess.

7. The transistor with dual spacers according to claim 5, further comprising:

a lightly doped source/drain disposed in the substrate beside the spacer.

* * * * *